(12) United States Patent
Seok et al.

(10) Patent No.: US 8,344,480 B2
(45) Date of Patent: Jan. 1, 2013

(54) INSULATED GATE BIPOLAR TRANSISTOR

(75) Inventors: Kyoung-Wook Seok, Milpitas, CA (US); Vladimir Tsukanov, Palo Alto, CA (US)

(73) Assignee: IXYS Corporation, Milpitas, CA (US)

( * ) Notice: Subject to any disclaimer, the term of this patent is extended or adjusted under 35 U.S.C. 154(b) by 0 days.

(21) Appl. No.: 12/571,155

(22) Filed: Sep. 30, 2009

(65) Prior Publication Data
US 2010/0078674 A1   Apr. 1, 2010

Related U.S. Application Data

(60) Provisional application No. 61/101,653, filed on Sep. 30, 2008.

(51) Int. Cl.
*H01L 27/082* (2006.01)
*H01L 27/102* (2006.01)
*H01L 29/70* (2006.01)
*H01L 31/11* (2006.01)

(52) U.S. Cl. .................. 257/565; 257/E29.197
(58) Field of Classification Search .......... 257/565, 257/E29.197
See application file for complete search history.

(56) References Cited

U.S. PATENT DOCUMENTS

| | | | |
|---|---|---|---|
| 5,380,670 A | 1/1995 | Hagino | |
| 5,714,775 A | 2/1998 | Inoue et al. | |
| 6,392,273 B1 | 5/2002 | Chang | |
| 6,399,998 B1 | 6/2002 | Chang | |
| 6,683,331 B2 | 1/2004 | Francis et al. | |
| 6,737,705 B2 * | 5/2004 | Momota et al. | ............... 257/330 |
| 6,815,769 B2 | 11/2004 | Pfirsch et al. | |
| 7,063,975 B2 | 6/2006 | Tsukanov et al. | |
| 7,427,800 B2 | 9/2008 | Yilmaz | |
| 2006/0244104 A1 | 11/2006 | Ozeki et al. | |
| 2008/0283867 A1 | 11/2008 | Mori et al. | |
| 2009/0146177 A1 | 6/2009 | Ng et al. | |

FOREIGN PATENT DOCUMENTS

| | | |
|---|---|---|
| EP | 1032047 A2 | 8/2000 |
| EP | 1 793 423 A2 | 6/2007 |
| JP | 2000-307116 A | 11/2000 |

OTHER PUBLICATIONS

Baliga *Power Semiconductor Devices*, PWS Publishing Co., section 8.5.3, pp. 472-473 (Dec. 1996).
Supplementary European Search Report for European application EP09818446 (May 10, 2012).

* cited by examiner

*Primary Examiner* — Thien F Tran
(74) *Attorney, Agent, or Firm* — Kilpatrick Townsend & Stockton LLP

(57) ABSTRACT

A trench structure of an insulated gate bipolar transistor (IGBT) is formed as a trench net in a P region and extends into an N− layer. The trench net separates the P region into P wells and floating P layers. The P wells contact an emitter electrode while the floating P layers are not in direct contact with the emitter electrode. A gate formed of conductive material and having a surrounding insulation oxide layer is formed in the trench net. An N+ layer may be formed above each floating P layer under the gate. The floating P layers are isolated from the gate and are also not connected to the emitter electrode.

28 Claims, 4 Drawing Sheets

INSULATED GATE BIPOLAR TRANSISTOR

CROSS-REFERENCE TO RELATED APPLICATIONS

This application claims priority to U.S. Provisional Patent Application No. 61/101,653, filed on Sep. 30, 2008, which is incorporated herein for all purposes.

TECHNICAL FIELD

Embodiments of the invention are directed to a power semiconductor device and, more particularly, to an insulated gate bipolar transistor.

BACKGROUND

An insulated gate bipolar transistor (IGBT) is a three-terminal power semiconductor device with a low voltage drop, high efficiency and fast switching operational characteristics. The IGBT is used to switch electric power in many modern appliances. The IGBT combines the gate-drive characteristics of a metal oxide semiconductor field effect transistor (MOSFET) with the high current and low saturation voltage capability of bipolar transistors by combining an isolated gate FET for the control input and a bipolar power transistor as a switch in a single device.

FIGS. 1a and 1b illustrate a conventional trench IGBT structure. FIG. 1a is a top partially cut away view of the conventional trench IGBT structure, and FIG. 1b is a cross-sectional view of the conventional trench IGBT structure taken along line A-A'. The trench IGBT structure includes a collector electrode 100. A P+ layer 110 is formed above the collector electrode 100, and an N layer 120 is formed above the P+ layer 110. An N− layer 130 is formed above the N layer 120, and P wells 140 are formed above the N− layer 180. A trench is formed between adjacent P wells 140 and extends into the N− layer 130 such that the adjacent P wells 140 are isolated from each other. An N+ source region 150 is formed in each upper corner of each P well 140 proximate the trench. A gate 160 is formed in each trench. The gate 160 is surrounded by an oxide layer 170 such that the oxide layer 170 is provided between the gate 160 and the N− layer 130, the P wells 140 and the N+ source regions 150. An emitter electrode 180 is formed above the P wells 140, the N+ source regions 150 and the gate 160 including the oxide layer 170.

The conductivity of a semiconductor may be varied in proportion to the density of charge carriers. For example, increasing the amount of charge carriers increases the conductivity of the device. This phenomenon is referred to as "conductivity modulation." FIG. 1c illustrates a graph of charge carrier densities (i.e., electron and hole densities) in the N− layer 130 and the N layer 120 of the conventional trench IGBT structure shown in FIGS. 1a and 1b.

In operation, when a positive voltage is applied to the gate 160, electrons move from the N+ source regions 150 and the P wells 140 into the N− layer 130 and the N layer 120. However, the electrons do not easily traverse the junction barrier between the N layer 120 and the P+ layer 110, resulting in increased electron density at the barrier. In the opposite direction, holes from the P+ layer 110 move into the N layer 120 and the N− layer 130. The holes in the N− layer 130 easily traverse the junction and into the P wells 140 which decreases the charge carrier density at the junction. Thus, the conventional IGBT structure causes many holes to escape.

In order to limit the amount of holes that escape the N− layer 130 and enter the P wells 140, a width of the gate 160 may be increased to create a wide trench IGBT. A wide trench IGBT structure enhances conductivity modulation because a bottom of the wide trench blocks hole escape through the P wells 140 and also supplies electrons to combine with the holes. The electrons compensate for the positive charge of the holes. The density of electrons and holes can be increased under the wide trench. As a result, the wide trench IGBT structure promotes conductivity modulation of the N layer 120 and the N− layer 130 of the device. However, conventional wide trench IGBTs may be structurally unstable and mechanically weak, and are also difficult to manufacture.

Therefore, it is desirable to provide an improved wide trench IGBT structure.

SUMMARY

The present invention is directed to a trench structure of an insulated gate bipolar transistor (IGBT). The trench structure includes a P+ layer formed over a collector electrode, an N layer formed over the P+ layer, and an N− layer formed over the N layer. A P region is formed over the N− layer. A trench net is formed in the P region and extends into the N− layer. The trench net separates the P region into P wells and floating P layers. The P wells contact an emitter electrode while the floating P layers are not in direct contact with the emitter electrode. An N+ source region is formed in each upper corner of each P well, and an N+ layer may be formed above each floating P layer.

A gate formed of conductive material and having a surrounding insulation oxide layer is formed in the trench net. In some embodiments, the trench net may be ladder-shaped with several first lateral portions connected between a pair of longitudinal portions. In other embodiments, the trench net may additionally include second lateral portions that are offset from the first lateral portions and that are connected to different pairs of the longitudinal portions. In still other embodiments, the trench net may include discontinuous lateral portions and discontinuous longitudinal portions that are interconnected.

Due to the presence of the trench net, each gate is formed such that the P wells are formed between pairs of longitudinal portions of the gates, and the floating P layers and each corresponding N+ layer are formed under the gate between different pairs of longitudinal portions of the gates. The emitter electrode is formed to contact the P wells, the N+ source regions, and the oxide layer of the gate between the longitudinal portions. Thus, the floating P layers are isolated from the gate and are also not connected to the emitter electrode.

In operation, when a gate voltage is applied that is higher than a predetermined threshold, two inversion channels and one accumulation channel are formed at an interface between the gate oxide layer and silicon. The two inversion channels are formed under the gate where the floating P layers and each P well contact the gate oxide layer. The accumulation channel is formed under the gate where the N− layer meets the gate oxide layer. Through the two inversion channels and the accumulation channel, electrons from the N+ source regions move into each N+ layer over the floating P layers.

Some of the holes injected from the P+ layer to the N− layer move into the P wells connected to the emitter electrode. Other holes in the N− layer move into the floating P layers. These holes combine with electrons from the N+ source regions through the two inversion channels and the accumulation channel. Because the electrons compensate for the positive charge of the holes, the density of electrons and holes can be increased near the floating P layers. As a result, the IGBT structure in accordance with embodiments of the present invention provides a low-loss IGBT, while also promoting conductivity modulation of the N layer and the N− layer of the device.

Some embodiments of the present invention are directed to an IGBT. The IGBT includes a P+ layer formed over a collector electrode, an N− layer formed over the P+ layer, and a P region formed over the N− layer. A trench net is formed in the P region such that the trench net separates the P region into P wells and floating P layers provided between the P wells. An N+ source region is formed in each upper corner of each P well. A gate surrounded with an insulating oxide layer is formed in the trench net. An emitter electrode is provided over each P well. The floating P layers are not connected to the emitter electrode.

Some embodiments of the present invention are directed to an IGBT. The IGBT includes a first carrier layer formed over a collector electrode, a second carrier layer formed over the first carrier layer, and a third carrier region formed over the second carrier layer. A trench net is formed in the third carrier region such that the trench net separates the third carrier region into third carrier wells and floating third carrier layers provided between the third carrier wells. An fourth carrier region is formed in each upper corner of each third carrier well. A gate surrounded with an insulating oxide layer is formed in the trench net. An emitter electrode is provided over each third carrier well. The floating third carrier layers are not connected to the emitter electrode.

A further understanding of the nature and advantages of the present invention may be realized by reference to the remaining portions of the specification and the drawings.

BRIEF DESCRIPTION OF THE DRAWINGS

FIG. 1b is a cross-sectional view of a conventional trench IGBT structure taken along line A-A' of FIG. 1a.

FIG. 2b is a cross-sectional view taken along line B-B' of FIG. 2a.

FIG. 2c is a cross-sectional view taken along line C-C' of FIG. 2a.

FIG. 3b is a cross-sectional view taken along line D-D' of FIG. 3a.

FIG. 4b is a cross-sectional view taken along line E-E' of FIG. 4a.

DETAILED DESCRIPTION

Embodiments of the invention are directed to a trench structure of an insulated gate bipolar transistor (IGBT). A trench net is formed in a P region and extends into an N− layer. The trench net separates the P region into P wells and floating P layers. An N+ source region is formed in each upper corner of each P well, and an N+ layer may be formed above each floating P layer. The P wells contact an emitter electrode while the floating P layers are not in direct contact with the emitter electrode. A gate formed of conductive material and having a surrounding insulation oxide layer is formed in the trench net. Due to the presence of the trench net, each gate is formed such that the P wells are formed between pairs of longitudinal portions of the gates, and the floating P layers and the N+ layers are formed under each gate between different pairs of longitudinal portions of the gates. The emitter electrode is formed to contact the P wells, the N+ source regions, and the oxide layer of the gate between the longitudinal portions. Thus, the floating P layers are isolated from the gate and are also not connected to the emitter electrode.

In operation, when a gate voltage is applied that is higher than a predetermined threshold, two inversion channels and one accumulation channel are formed at the interface between the gate oxide layer and silicon. Some of the holes injected from a P+ layer to the N− layer move into the P wells connected to the emitter electrode. Other holes in the N− layer move into the floating P layers. These holes combine with electrons from the N+ source regions through the two inversion channels and the accumulation channel. Because the electrons compensate for the positive charge of the holes, the density of electrons and holes can be increased near the floating P layers. As a result, the IGBT structure in accordance with embodiments of the present invention provides a low-loss IGBT, while also promoting conductivity modulation of the N layer and the N− layer of the device.

As used herein, a "+" (i.e., P+ or N+) denotes a carrier concentration of at least $1 \times 10^{18}/cm^3$, and "−" (i.e., P− or N−) denotes a carrier concentration of less than $5 \times 10^{16}/cm^3$.

Figure 1A:
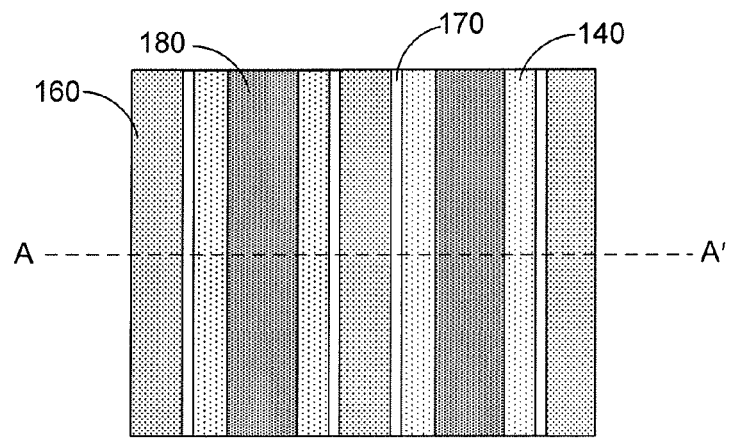
FIG. 1a is a top partially cut-away view of a conventional trench IGBT structure.
Figure 1B:
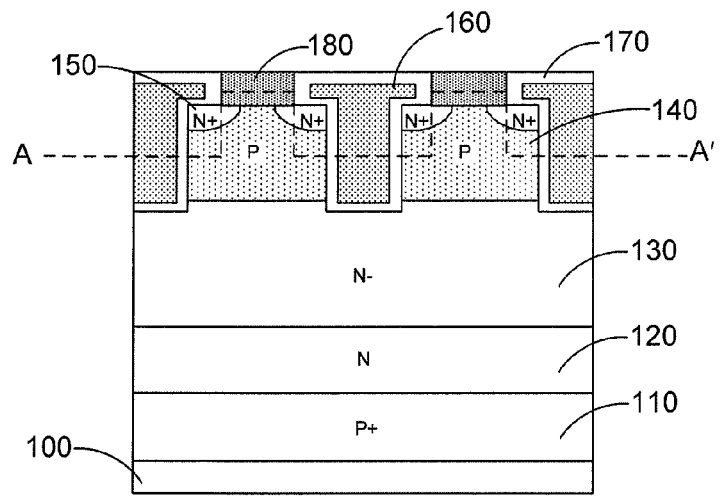
Figure 1C:
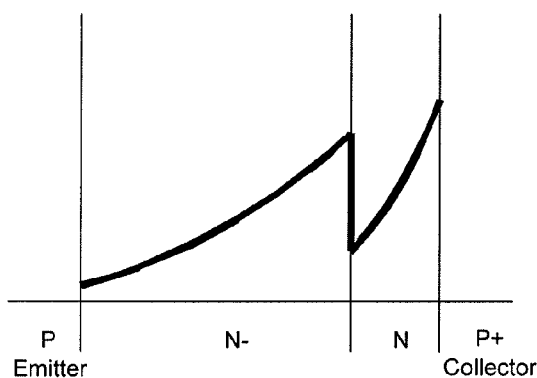
FIG. 1c is a graph illustrating charge densities in a conventional trench IGBT structure.
Figure 2A:
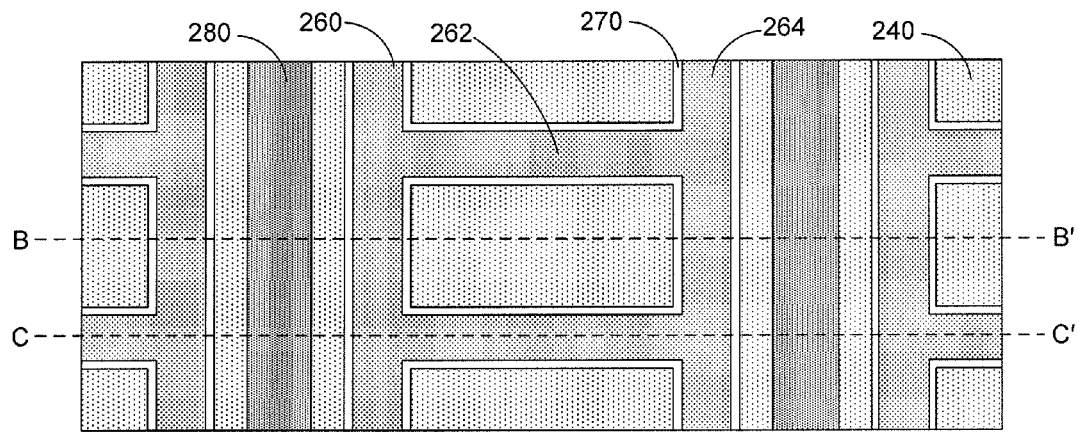
FIG. 2a is a top partially cut-away view of a wide trench IGBT structure.
Figure 2B:
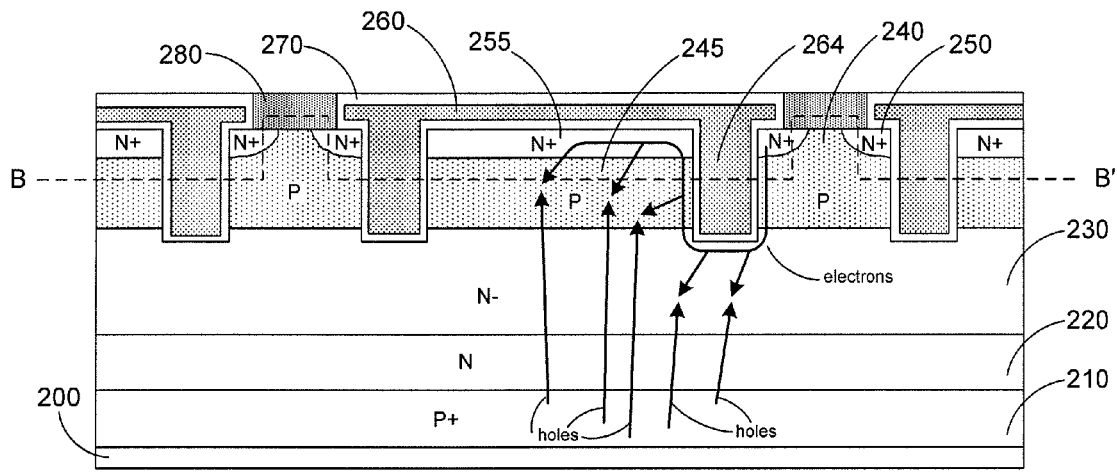
Figure 2C:
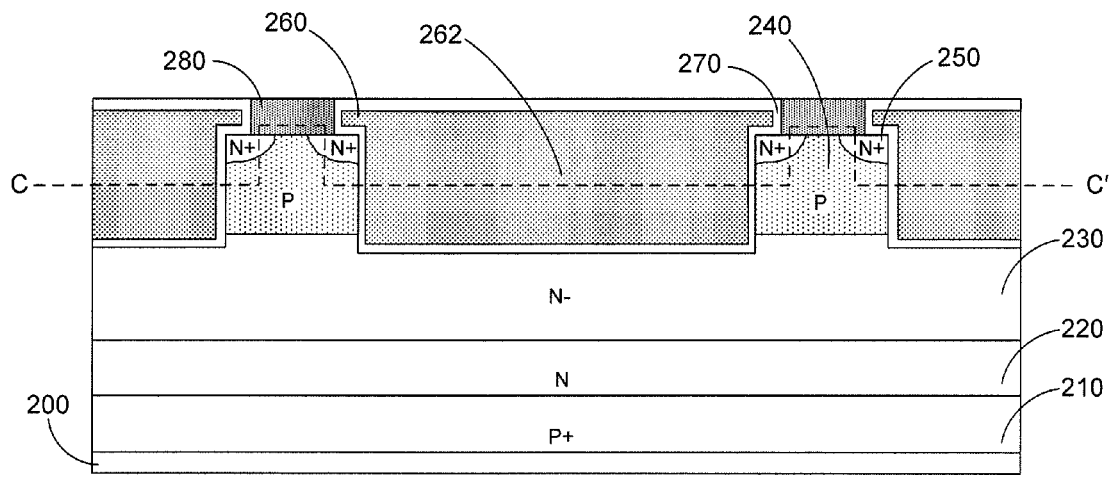

FIGS. 2a-2c illustrate a wide trench IGBT structure in accordance with embodiments of the invention. FIG. 2a is a top, partially cut-away view of a wide trench IGBT structure. FIG. 2b is a cross-sectional view taken along line B-B' of FIG. 2a, and FIG. 2c is a cross-sectional view taken along line C-C' of FIG. 2a.

A P+ layer 210 is formed over a collector electrode 200, an N layer 220 is formed over the P+ layer 210, and an N− layer 230 is formed over the N layer 220. A P region is formed over the N− layer 230. A trench net is formed in the P region and extends into the N− layer 230. The trench net separates the P region into P wells 240 and floating P layers 245. An N+ source region 250 is formed in each upper corner of each P well 240. An N+ layer 255 may be formed above each floating P layer 245. The P wells 240 contact an emitter electrode 280 while the floating P layers 245 are not in direct contact with the emitter electrode 280.

A gate 260 formed of conductive material (e.g., polysilicon) and having a surrounding insulation oxide layer 270 is formed in the trench net. As shown in FIG. 2a, the trench net is ladder-shaped with several lateral portions 262 connected between two longitudinal portions 264. Thus, each gate 260 is formed such that the P wells 240 are formed between adjacent gates 260, and the floating P layers 245 and the N+ layers 255 are formed under each gate 260 between the two longitudinal portions 264 and between adjacent lateral portions 262. As one having skill in the art would appreciate, the trench net may have other configurations than the ladder-shaped trench shown in FIG. 2a. Other examples of the trench net configuration are described below.

Referring to FIG. 2c, the lateral portion 262 of the trench net forms a wide trench between adjacent P wells 240. However, as shown in FIG. 2b, the trench net prevents the gate 260 from having only a wide trench structure. In other words, the formation of the floating P layers 245 and the N+ layers 255 under the gate 260 and between the longitudinal portions 264 of the gate 260 eliminates the wide trench in this area, resulting in only the lateral portions 262 of the gate 260 having the wide trench structure.

The emitter electrode 280 is formed to contact the P wells 240, the N+ source regions 250, and the oxide layer 270 of the gate 260 between the longitudinal portions 264. Thus, the floating P layers 245 are isolated from the gate 260 and are also not connected to the emitter electrode 280.

In operation, a voltage is applied to the gate 260 that is higher than a threshold voltage. For example, a positive voltage with respect to the emitter electrode 280 is applied to the gate 260. The oxide layer 270 on sidewalls of the gate 260 that are adjacent to the P wells 240 cause N− type inversion channels to be formed across the P wells 240 between the N+ source regions 250 and the N− layer 230. The inversion channels allow electrons to flow from the N+ source regions 250 and the P wells 240 to the N− layer 230 and the N layer 220. The P+ layer 210 responds by injecting holes into the N layer 220 and the N− layer 260, allowing current to flow from the collector electrode 200 to the emitter electrode 280.

In addition to the inversion channels, the positive gate voltage causes an accumulation channel to be formed below the gate 260 near an interface between the N− layer 230 and the gate oxide layer 270. Thus, electrons can move through the two inversion channels and the accumulation channel from the N+ source regions 260 to the N+ layer 255.

Some of the holes injected from the P+ layer 210 to the N− layer 230 move into the P wells 240 connected to the emitter electrode 280. Other holes in the N− layer 230 move into the floating P layers 245. These holes combine with electrons from the N+ source regions 250 through the two inversion channels and the accumulation channel. Because the electrons compensate for the positive charge of the holes, the density of electrons and holes can be increased near the floating P layers 245. As a result, the IGBT structure in accordance with embodiments of the present invention provides a low-loss IGBT, while also promoting conductivity modulation of the N layer 220 and the N− layer 230 of the device.

Figure 3A:
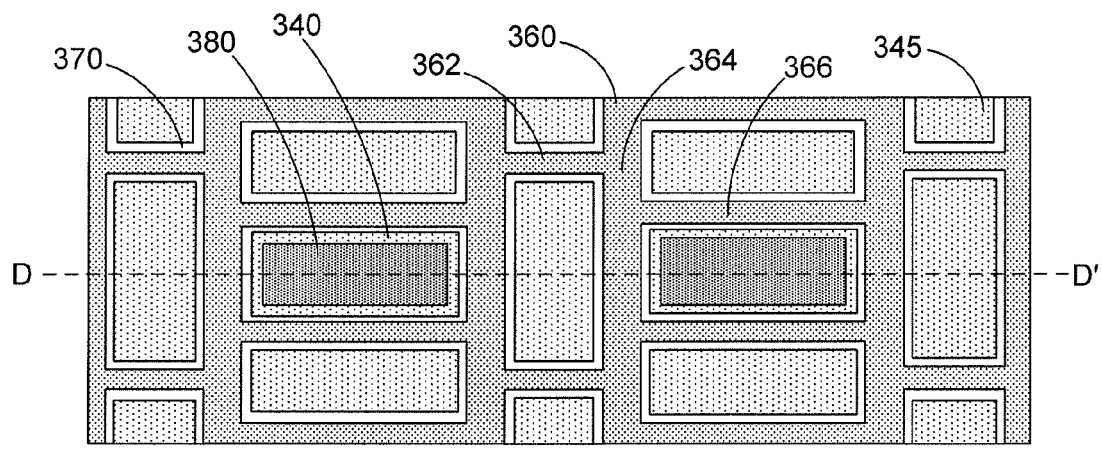
FIG. 3a is a top partially cut-away view of a trench IGBT structure.
Figure 3B:
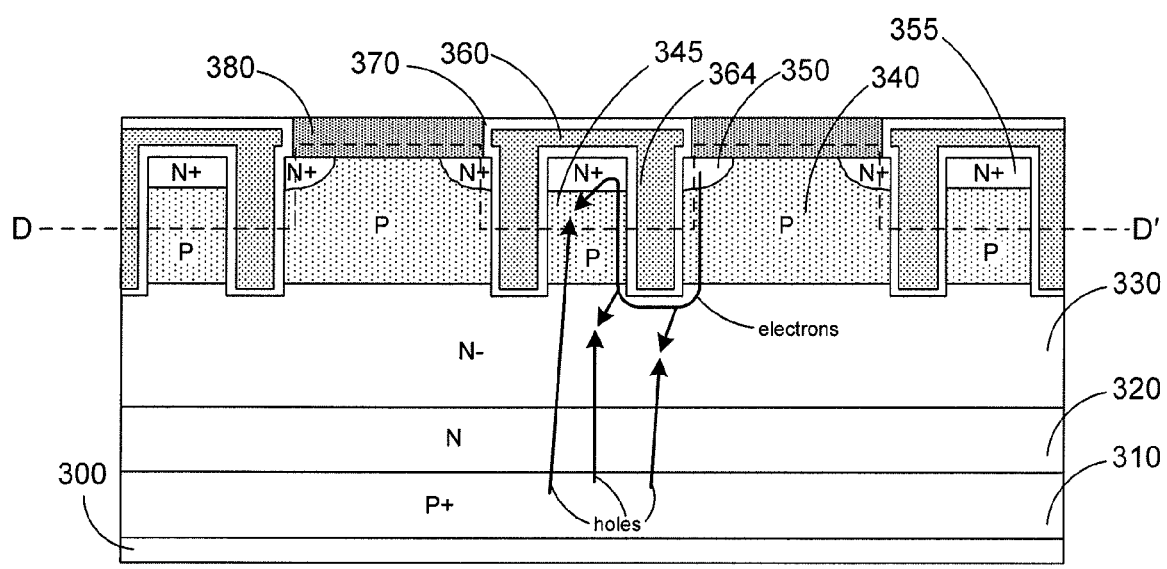

FIGS. 3a and 3b illustrate a wide trench IGBT structure in accordance with embodiments of the invention. FIG. 3a is a top partially cut-away view of a trench IGBT structure. FIG. 3b is a cross-sectional view taken along line D-D' of FIG. 3a.

As described above with reference to FIGS. 2a-2c, a P+ layer 310 is formed over a collector electrode 300, an N layer 320 is formed over the P+ layer 310, and an N− layer 330 is formed over the N layer 320. A P region is formed over the N− layer 330. A trench net is formed in the P region and extends into the N− layer 330. The trench net separates the P region into P wells 340 and floating P layers 345. An N+ source region 350 is formed in each upper corner of each P well 340. An N+ layer 355 may be formed above each floating P layer 345. The P wells 340 contact an emitter electrode 380 while the floating P layers 345 are not in direct contact with the emitter electrode 380.

A gate 360 formed of conductive material (e.g., polysilicon) and having a surrounding insulation oxide layer 370 is formed in the trench net. As described with reference to FIG. 2a, the trench net is ladder-shaped with several lateral portions 362 connected between two longitudinal portions 364. As a result, the P floating layers 345 and the N+ layers 355 are formed between the longitudinal portions 364 and adjacent lateral portions 262. As shown in FIG. 3a, additional lateral portions 366 are formed between adjacent longitudinal portions 364 corresponding to different ladder-shaped trenches. The additional lateral portions 366 are offset from the lateral portions 362. As a result, the trench net is formed to be in the shape of a ladder with the additional lateral portions 366 provided between each ladder shaped trench.

In this configuration of the trench net, each gate 360 is formed such that the floating P layers 345 and the N+ layers 355 are formed under the gate 360 between the two longitudinal portions 364 and between adjacent lateral portions 362. In addition, the P wells 340 including the N+ source regions 350 are provided between adjacent longitudinal portions 364 and adjacent additional lateral portions 366. As one having skill in the art would appreciate, the trench net may be shaped differently than the configuration shown in FIG. 3a.

As described with reference to FIG. 2c, the lateral portion 362 of the trench net forms a wide trench between adjacent P wells 340. However, as shown in FIG. 3b, the trench net prevents the gate 360 from having only a wide trench structure. In other words, the formation of the floating P layers 345 and the N+ layers 355 under the gate 360 and between the longitudinal portions 364 and the additional lateral portions 366 of the gate 360 eliminates the wide trench in this area, resulting in only the lateral portions 362 of the gate 360 having the wide trench structure.

The emitter electrode 380 is formed to contact the P wells 340, the N+ source regions 350, and the oxide layer 370 of the gate 360 between the longitudinal portions 364 and the additional lateral portions 366. Thus, the floating P layers 345 are isolated from the gate 360 and are also not connected to the emitter electrode 380.

In operation, a voltage is applied to the gate 360 that is higher than a threshold voltage. For example, a positive voltage with respect to the emitter electrode 380 is applied to the gate 360. The oxide layer 370 on sidewalls of the gate 360 that are adjacent to the P wells 340 cause N− type inversion channels to be formed across the P wells 340 between the N+ source regions 350 and the N− layer 330. The inversion channels allow electrons to flow from the N+ source regions 350 and the P wells 340 to the N− layer 330 and the N layer 320. The P+ layer 310 responds by injecting holes into the N layer 320 and the N− layer 360, allowing current to flow from the collector electrode 300 to the emitter electrode 380.

In addition to the inversion channels, the positive gate voltage causes an accumulation channel to be formed below the gate 360 near an interface between the N− layer 330 and the gate oxide layer 370. Thus, electrons can move through the two inversion channels and the accumulation channel from the N+ source regions 360 to the N+ layer 355.

Some of the holes injected from the P+ layer 310 to the N− layer 330 move into the P wells 340 connected to the emitter electrode 380. Other holes in the N− layer 330 move into the floating P layers 345. These holes combine with electrons from the N+ source regions 350 through the two inversion channels and the accumulation channel. Because the electrons compensate for the positive charge of the holes, the density of electrons and holes can be increased near the floating P layers 345. As a result, the IGBT structure in accordance with embodiments of the present invention provides a low-loss IGBT, while also promoting conductivity modulation of the N layer 320 and the N− layer 330 of the device.

Figure 4A:
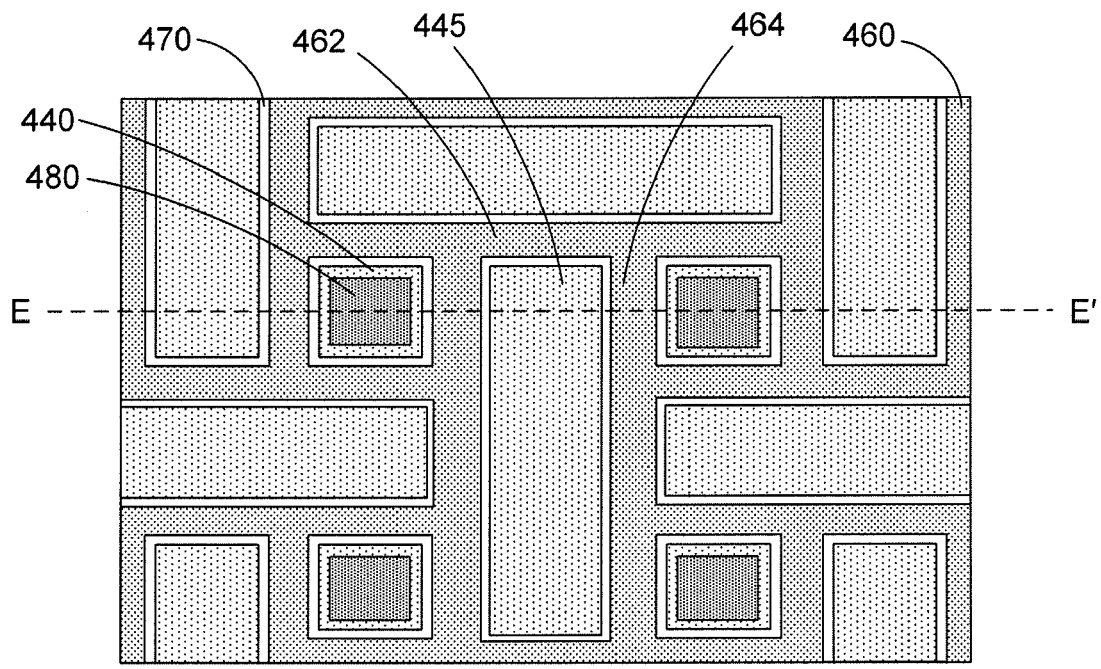
FIG. 4a is a top partially cut-away view of a trench IGBT structure.
Figure 4B:
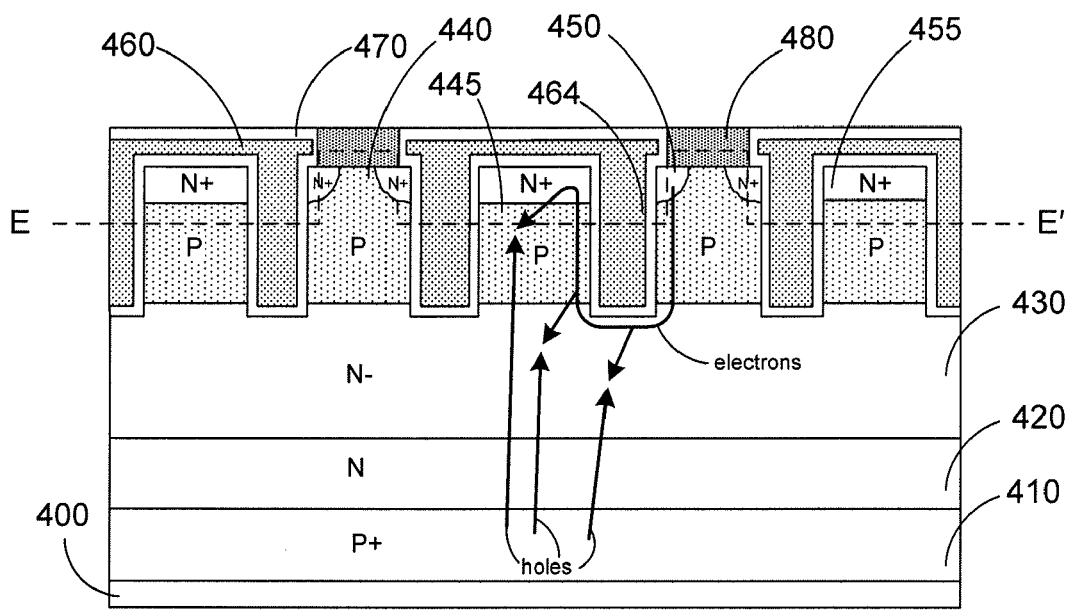

FIGS. 4a and 4b illustrate a wide trench IGBT structure in accordance with embodiments of the invention. FIG. 4a is a top partially cut-away view of a trench IGBT structure. FIG. 4b is a cross-sectional view taken along line E-E' of FIG. 4a.

As described above with reference to FIGS. 3a and 3b, a P+ layer 410 is formed over a collector electrode 400, an N layer 420 is formed over the P+ layer 410, and an N− layer 430 is formed over the N layer 420. A P region is formed over the N− layer 430. A trench net is formed in the P region and extends into the N− layer 430. The trench net separates the P region into P wells 440 and floating P layers 445. An N+ source region 450 is formed in each upper corner of each P well 440. An N+ layer 455 may be formed above each floating P layer 445. The P wells 440 contact an emitter electrode 480 while the floating P layers 445 are not in direct contact with the emitter electrode 480.

A gate 460 formed of conductive material (e.g., polysilicon) and having a surrounding insulation oxide layer 470 is formed in the trench net. The trench net is formed such that the gate 460 includes several lateral portions 462 and several longitudinal portions 464. However, unlike the trench net illustrated in FIG. 3a, the longitudinal portions 464 of the gate 460 are separated by the P floating layers 445 and the N+ layers 455 formed under the gate 460. Thus, the trench net is configured as a rectangular lattice with discontinuous longitudinal portions 464 and discontinuous lateral portions 462.

In this configuration of the trench net, each gate 460 is formed such that the floating P layers 445 and the N+ layer s455 are formed under the gate 460 between adjacent longitudinal portions 464 and between adjacent lateral portions 462. In addition, the P wells 440 including the N+ source regions 450 are provided between adjacent longitudinal portions 464 and adjacent additional lateral portions 462. As a result, each P well 440 is separated from each adjacent P floating layer 445 and N+ layer 455 by a lateral portion 462 or a longitudinal portion 464 of the gate 460. Relative to the trench net configuration shown in FIG. 3a, the trench net illustrated in FIG. 4a has smaller P wells 440 in a lateral direction and larger P floating layers 445 and N+ layers 455 under the gate 460 in the longitudinal direction. As one having skill in the art would appreciate, the trench net may have other configurations than the rectangular lattice trench shown in FIG. 4a.

An emitter electrode 480 is formed over the resulting structure such that the emitter electrode 480 contacts the P wells 440, the N+ source regions 450, and the oxide layer 470 of the gate 460 between the longitudinal portions 464 and the lateral portions 462. Thus, the floating P layers 445 are isolated from the gate 460 and are also not connected to the emitter electrode 480.

In operation, a voltage is applied to the gate 460 that is higher than a threshold voltage. For example, a positive voltage with respect to the emitter electrode 480 is applied to the gate 460. The oxide layer 470 on sidewalls of the gate 460 that are adjacent to the P wells 440 cause N− type inversion channels to be formed across the P wells 440 between the N+ source regions 450 and the N− layer 430. The inversion channels allow electrons to flow from the N+ source regions 450 and the P wells 440 to the N− layer 430 and the N layer 420. The P+ layer 410 responds by injecting holes into the N layer 420 and the N− layer 460, allowing current to flow from the collector electrode 400 to the emitter electrode 480.

In addition to the inversion channels, the positive gate voltage causes an accumulation channel to be formed below the gate 460 near an interface between the N− layer 430 and the gate oxide layer 470. Thus, electrons can move through the two inversion channels and the accumulation channel from the N+ source regions 460 to the N+ layer 455.

Some of the holes injected from the P+ layer 410 to the N− layer 430 move into the P wells 440 connected to the emitter electrode 480. Other holes in the N− layer 430 move into the floating P layers 445. These holes combine with electrons from the N+ source regions 450 through the two inversion channels and the accumulation channel. Because the electrons compensate for the positive charge of the holes, the density of electrons and holes can be increased near the floating P layers 445. As a result, the IGBT structure in accordance with embodiments of the present invention provides a low-loss IGBT, while also promoting conductivity modulation of the N layer 420 and the N− layer 430 of the device.

As disclosed above, a trench structure of an IGBT is formed as a trench net in a P region and extends into an N− layer. The trench net separates the P region into P wells and floating P layers. A gate formed of conductive material and having a surrounding insulation oxide layer is formed in the trench net. An N+ layer may be formed above each floating P layer under the gate. The P wells contact an emitter electrode while the floating P layers are not in direct contact with the emitter electrode. The floating P layers are also isolated from the gate and is also not connected to the emitter electrode. As a result, the IGBT structure in accordance with embodiments of the present invention provides a low-loss IGBT, while also promoting conductivity modulation of the N layer and the N− layer of the device.

While the invention has been particularly shown and described with reference to specific embodiments, it will be understood by those skilled in the art that the foregoing and other changes in the form and details may be made therein without departing from the spirit or scope of the invention. Therefore, the scope of this invention should not be limited to the embodiments described above, and should instead be defined by the following claims.

What is claimed is:

1. An insulated gate bipolar transistor comprising:
   a P+ layer formed over a collector electrode;
   an N− layer formed over the P+ layer;
   a P region formed over the N− layer;
   a trench net formed in the P region, wherein the trench net separates the P region into P wells and floating P layers provided between the P wells;
   an N+ source region formed in each upper corner of each P well;
   an N+ layer formed over each floating P layer;
   a gate formed in the trench net, wherein the gate is surrounded with an insulating oxide layer and is provided over the N+ layer and between the P wells; and
   an emitter electrode provided over each P well.

2. The insulated gate bipolar transistor of claim 1, wherein the trench net extends into the N− layer between the floating P layers and the P wells.

3. The insulated gate bipolar transistor of claim 1, wherein the floating P layers are not connected to the emitter electrode.

4. The insulated gate bipolar transistor of claim 1, wherein the floating P layers are isolated from the gate by the insulating oxide layer.

5. The insulated gate bipolar transistor of claim 1, further comprising an N layer between the N− layer and the P+ layer.

6. The insulated gate bipolar transistor of claim 1, wherein the trench net is ladder shaped and comprises two longitudinal portions and a plurality of lateral portions formed between the longitudinal portions.

7. The insulated gate bipolar transistor of claim 1, wherein the floating P layers and the N+ layers are formed between the longitudinal portions and between adjacent lateral portions.

8. The insulated gate bipolar transistor of claim 1, wherein the trench net is ladder shaped and comprises a plurality of longitudinal portions, a plurality of first lateral portions formed between a pair of the longitudinal portions, and a plurality of second lateral portions formed between a different pair of the longitudinal portions.

9. The insulated gate bipolar transistor of claim 8, wherein the second lateral portions are offset from the first lateral portions.

10. The insulated gate bipolar transistor of claim 8, wherein the floating P layers and the N+ layers are formed between a pair of adjacent longitudinal portions and between a pair of adjacent first lateral portions.

11. The insulated gate bipolar transistor of claim 1, wherein the trench net is shaped as a rectangular lattice and comprises a plurality of longitudinal portions and a plurality of lateral portions, each lateral portion being connected to at least two longitudinal portions.

12. The insulated gate bipolar transistor of claim 11, wherein the lateral portions include discontinuous lateral portions.

13. The insulated gate bipolar transistor of claim 11, wherein the longitudinal portions include discontinuous longitudinal portions.

14. The insulated gate bipolar transistor of claim 11, wherein the floating P layers and the N+ layers are formed between a pair of longitudinal portions and between a pair of lateral portions.

15. An insulated gate bipolar transistor comprising:
   a P+ layer formed over a collector electrode;
   an N− layer formed over the P+ layer;
   a P region formed over the N− layer;
   a trench net formed in the P region, wherein the trench net separates the P region into P wells and floating P layers provided between the P wells; wherein the trench net is ladder shaped and comprises two longitudinal portions and a plurality of lateral portions formed between the longitudinal portions;
   an N+ source region formed in each upper corner of each P well;
   a gate formed in the trench net, wherein the gate is surrounded with an insulating oxide layer; and
   an emitter electrode provided over each P well.

16. The insulated gate bipolar transistor of claim 15 wherein the trench net extends into the N− layer between the floating P layers and the P wells.

17. The insulated gate bipolar transistor of claim 15 wherein the floating P layers are not connected to the emitter electrode.

18. The insulated gate bipolar transistor of claim 15 further comprising an N+ layer formed over each floating P layer.

19. The insulated gate bipolar transistor of claim 18 wherein the gate is provided over the N+ layer and between the P wells.

20. The insulated gate bipolar transistor of claim 18 wherein the floating P layers are electrically isolated from the gate by the insulating oxide layer.

21. The insulated gate bipolar transistor of claim 20 further comprising an N layer between the N− layer and the P+ layer.

22. The insulated gate bipolar transistor of claim 21 wherein the floating P layers and the N+ layers are formed between the longitudinal portions and between adjacent lateral portions.

23. The insulated gate bipolar transistor of claim 18 wherein the floating P layers and the N+ layers are formed between a pair of adjacent longitudinal portions and between a pair of adjacent first lateral portions of the trench net.

24. The insulated gate bipolar transistor of claim 15 wherein the trench net is ladder shaped and comprises a plurality of longitudinal portions, a plurality of first lateral portions formed between a pair of the longitudinal portions, and a plurality of second lateral portions formed between a different pair of the longitudinal portions.

25. The insulated gate bipolar transistor of claim 24 wherein the second lateral portions are offset from the first lateral portions.

26. The insulated gate bipolar transistor of claim 15 wherein the trench net is shaped as a rectangular lattice and comprises a plurality of longitudinal portions and a plurality of lateral portions, each lateral portion being connected to at least two longitudinal portions.

27. The insulated gate bipolar transistor of claim 26 wherein the lateral portions include discontinuous lateral portions.

28. The insulated gate bipolar transistor of claim 27 wherein the longitudinal portions include discontinuous longitudinal portions.

* * * * *